United States Patent
Pust (10) Patent No.: US 11,158,769 B2
(45) Date of Patent: Oct. 26, 2021

(54) OPTOELECTRONIC COMPONENT AND BACKGROUND LIGHTING FOR A DISPLAY

(71) Applicant: OSRAM OLED GmbH, Wernerwerkstrasse (DE)

(72) Inventor: Philipp Pust, Langquaid (DE)

(73) Assignee: OSRAM OLED GMBH, Regensburg (DE)

( * ) Notice: Subject to any disclaimer, the term of this patent is extended or adjusted under 35 U.S.C. 154(b) by 647 days.

(21) Appl. No.: 15/769,693

(22) PCT Filed: Nov. 25, 2016

(86) PCT No.: PCT/EP2016/078875
§ 371 (c)(1),
(2) Date: Apr. 19, 2018

(87) PCT Pub. No.: WO2017/093140
PCT Pub. Date: Jun. 8, 2017

(65) Prior Publication Data
US 2020/0279978 A1    Sep. 3, 2020

(30) Foreign Application Priority Data
Nov. 30, 2015  (DE) .......................... 102015120775.3

(51) Int. Cl.
*C09K 11/77*    (2006.01)
*H01L 33/50*    (2010.01)
(Continued)

(52) U.S. Cl.
CPC ............ *H01L 33/504* (2013.01); *C09K 11/02* (2013.01); *C09K 11/646* (2013.01); *C09K 11/7706* (2013.01); *H01L 2933/0041* (2013.01)

(58) Field of Classification Search
CPC ................................................. C09K 11/7734
See application file for complete search history.

(56) References Cited

U.S. PATENT DOCUMENTS

2009/0140205 A1*  6/2009  Watanabe
2010/0181580 A1   7/2010  Masuda
(Continued)

FOREIGN PATENT DOCUMENTS

CA      2925738 A1    4/2015
CN      102299246 A   12/2011
(Continued)

OTHER PUBLICATIONS

Kim. Red-Emitting (Sr,Ca)AlSiN3:Eu2+ Phosphors Synthesized by Spark Plasma Sintering. ECS Journal of Solid State Science and Technology, 2 (2) R3021-R3025 (2013) (Year: 2013).*
(Continued)

*Primary Examiner* — Matthew E. Hoban
(74) *Attorney, Agent, or Firm* — Arent Fox LLP (57) ABSTRACT

The invention relates to an optoelectronic component (100) having a semiconductor chip (2) for generating a primary radiation in the blue spectral range, a conversion element (4) which is arranged in the beam path of the semiconductor chip and is designed to generate a secondary radiation from the primary radiation, wherein the conversion element (4) comprises at least one first phosphor (9) and a second phosphor (10), wherein the first phosphor (9) is $Sr(Sr_{1-x}Ca_x)Si_2Al_2N_6:Eu^{2+}$ and/or $(Sr_{1-y}Ca_y)[LiAl_3N_4]:Eu^{2+}$, where $0 \leq x \leq 1$ and $0 \leq y \leq 1$, wherein a total radiation (G) exiting from the component (100) is white mixed light.

16 Claims, 6 Drawing Sheets

(51) Int. Cl.
*C09K 11/02* (2006.01)
*C09K 11/64* (2006.01)

(56) References Cited

U.S. PATENT DOCUMENTS

| | | | |
|---|---|---|---|
| 2010/0219428 A1* | 9/2010 | Jung | F21K 9/64 257/89 |
| 2011/0316025 A1 | 12/2011 | Kuzuhara et al. | |
| 2015/0159085 A1* | 6/2015 | Izawa | |

FOREIGN PATENT DOCUMENTS

| | | |
|---|---|---|
| CN | 104781369 A | 7/2015 |
| DE | 202008018060 U1 | 5/2011 |
| DE | 102010012040 A1 | 9/2011 |
| DE | 102013214235 A1 | 1/2015 |
| DE | 102014105839 A1 | 10/2015 |
| DE | 102014107972 A1 | 10/2015 |
| EP | 2852655 A1 | 4/2015 |
| JP | 2009094199 A | 4/2009 |
| JP | 2010080935 A | 4/2010 |
| JP | 2010534755 A | 11/2010 |
| JP | 2012009639 A | 1/2012 |
| JP | 2014-72351 A | 4/2014 |
| JP | 2015106641 A | 6/2015 |
| JP | 2015163689 A | 9/2015 |
| JP | 2015526532 A | 9/2015 |
| WO | 2014/202464 A1 | 12/2014 |

OTHER PUBLICATIONS

Notice of Reasons for Rejection of Japanese Application No. 2018-516764, dated Feb. 26, 2019.
Pust, P. et al.: "Narrow-band red-emitting Sr[LiAl3N4]Eu2+ as a next-generation LED-phosphor material" Nature Materials, 13,9, 2014, S. 891-896.
1st Office Action received in Chinese Patent Application No. 201680060834.9, dated Oct. 9, 2019.
Notice of Reason for Rejection received in Japanese Patent Application No. 2018-516764, dated Oct. 15, 2019.

* cited by examiner

|  | CxCy | u'v' |
|---|---|---|
| 9-1 | 100% | 100% |
| 9-2 | 99% | 98% |
| 9-3 | 87% | 92% |
| 9-4 | 72% | 73% |

|  | CxCy | u'v' |
|---|---|---|
| 10-1 | 100% | 100% |
| 10-2 | 99% | 99% |
| 10-3 | 88% | 93% |
| 10-4 | 75% | 79% |

OPTOELECTRONIC COMPONENT AND BACKGROUND LIGHTING FOR A DISPLAY

The invention relates to an optoelectronic component. The invention further relates to a background lighting for a display.

Optoelectronic components, in particular light-emitting diodes (LEDs), are used for the backlighting of LCD filters in modern televisions, computer monitors and many other displays. This can be effected either directly or by indirect illumination via a light guide. Two essential requirements for these optoelectronic components are, on the one hand, maximum brightness and, on the other hand, coverage of the largest possible colour space in the CIE colour diagram. Conventional LCD filter systems consist of three or four colour filters (blue, green and red, or blue, green, yellow and red). However, these LCD filters have a broad half-width (FWHM, full width at half maximum) in the range of typically 70 nm to 120 nm.

One object of the invention is to provide an optoelectronic component which emits radiation efficiently during operation of the component. The invention further relates to a background lighting for a display which emits the radiation efficiently during operation of the background lighting.

These objects are achieved by an optoelectronic component according to independent claim 1. Advantageous embodiments and developments of the invention are the subject matter of the dependent claims. Furthermore, these objects are solved by a background lighting for a display according to independent claim 12.

In at least one embodiment, the optoelectronic component has a semiconductor chip. The semiconductor chip is designed to generate a primary radiation in the blue spectral range. The optoelectronic component has a conversion element. The conversion element is arranged in the beam path of the semiconductor chip. The conversion element is designed to generate secondary radiation from the primary radiation of the semiconductor chip. The conversion element has at least one first phosphor and one second phosphor or consists thereof. The first phosphor is either $Sr(Sr_{1-x}Ca_x)Si_2Al_2N_6:Eu^{2+}$ or $(Sr_{1-y}Ca_y)[LiAl_3N_4]:Eu^{2+}$ or a combination of both with $0 \leq x \leq 1$ and $0 \leq y \leq 1$. The total radiation exiting from the optoelectronic component is white mixed light.

According to at least one embodiment, the optoelectronic component is a light-emitting diode; the optoelectronic component is then preferably designed to emit white light for short.

Here and in the following, "total radiation" is understood to mean mixed radiation from one of the at least one semiconductor chip and a secondary radiation emitted by the conversion element, which ultimately leaves the component. The mixing ratio of primary radiation and secondary radiation can be regulated and controlled by the composition and the concentration of the corresponding phosphors in the conversion element. In the case of full conversion, the total radiation can also be only the secondary radiation. In the case of partial conversion, the total radiation can be the sum of primary radiation of the semiconductor chip and secondary radiation of the conversion element. The secondary radiation can be composed of an emitted radiation from the first phosphor and an emitted radiation from the second phosphor.

White mixed light of the component is generated here in particular by partial conversion. The term "white" is used here and below in the meaning that the overall radiation has a colour locus of the CIE colour diagram with Cx and Cy values along the Planck locus or in the isotherms thereof. For background illumination or lighting, the colour loci are preferably between colour temperatures of 7000 K and 25,000 K. For example, the colour locus can lie in the range of Cx 0.25-0.33 and Cy 0.22-0.33. The colour location here designates points in or on a colour body which is described in its position in the colour space with suitable coordinates. The colour locus represents the colour perceived by an observer. The colour locus is a coordinate or a number of coordinates in a standard valence system which is shifted from the CIE (the international lighting commission). Here and below, the CIE standard valence system is based on the standard of 1931. The CIE colour diagram forms the totality of all perceptible colours, that is to say the visible part of the electromagnetic radiation. Within this diagram, any desired colour is defined by means of three coordinates Cx, Cy, Cz, wherein two coordinates are sufficient for colour determination, since the sum of all three coordinates always has to be 1, Cz can therefore easily be calculated from Cx and Cy. Such a colour coordinate is referred to here as the colour locus of the total radiation.

According to at least one embodiment, the optoelectronic component has at least one semiconductor chip. Alternatively, the optoelectronic component can also have more than one semiconductor chip, for example a further semiconductor chip, that is to say two semiconductor chips. The semiconductor chips can have the same structure. The at least one optoelectronic semiconductor chip has a semiconductor layer sequence. The semiconductor layer sequence comprises an active layer having at least one pn-junction and/or having one or more quantum well structures. The semiconductor layer sequence of the semiconductor chip is preferably based on a III-V compound semiconductor material. The semiconductor material is preferably a nitride compound semiconductor material, such as $Al_nIn_{1-n-m}Ga_mN$, or else a phosphide compound semiconductor material, such as $Al_nIn_{1-n-m}Ga_mP$, wherein in each case $0 \leq n \leq 1$, $0 \leq m \leq 1$ and $n+m \leq 1$. The semiconductor material can likewise be $Al_xGa_{1-x}As$, where $0 \leq x \leq 1$. In this case, the semiconductor layer sequence can have dopants and additional constituents. For the sake of simplicity, however, only the essential components of the crystal lattice of the semiconductor layer sequence, i.e. Al, As, Ga, In, N or P, are shown even if these can be partially replaced and/or supplemented by small quantities of further substances.

In the operation of the at least one semiconductor chip or of two semiconductor chips, a primary radiation is generated in each case in the active layer. A wavelength or the wavelength maximum of the primary radiation is preferably in the ultraviolet and/or visible and/or IR spectral range, in particular at wavelengths between 420 nm and 800 nm inclusive, for example between 440 nm and 480 nm inclusive. The semiconductor chip is preferably set up during operation, to generate primary radiation from the blue spectral range.

According to at least one embodiment, the blue spectral range of the semiconductor chip has at least one or exactly one peak wavelength maximum between 380 nm and 480 nm inclusive.

Here and hereinafter, colour data relating to emitting conversion elements and/or total radiation and/or emitting semiconductor chips designate the respective spectral range of the electromagnetic radiation.

According to at least one embodiment, the optoelectronic component has a further semiconductor chip. The further semiconductor chip is designed in particular to emit a further primary radiation from the blue spectral range during operation. In this case, the total primary radiation is produced from the primary radiation of the first semiconductor chip and that of the further semiconductor chip. The semiconductor chip and the further semiconductor chip are arranged in particular in a common recess of a housing of an optoelectronic component. In particular, the conversion element is then shaped as a potting and surrounds both semiconductor chips in a form-fitting manner. Here and in the following, "form-fit" means that the conversion element directly mechanically and/or electrically surrounds both the radiation exit surfaces and the side surfaces of the respective semiconductor chips.

According to at least one embodiment of the component, said component comprises a conversion element. The conversion element is arranged in the beam path of the semiconductor chip. In particular, the conversion element is arranged directly on the semiconductor chip, that is to say on the radiation exit area of the semiconductor chip. Here and in the following, "directly" means that the conversion element is arranged directly on the radiation exit area of the semiconductor chip. No further layers, such as adhesive layers, or elements are thus present between the semiconductor chip and the conversion element. Alternatively, the conversion element and the semiconductor chip can also be spatially separated from one another. For example, an adhesive layer can be arranged between the semiconductor chip and the conversion element.

The conversion element is designed for at least partially absorbing primary radiation emitted by the at least one semiconductor chip, or the conversion element is designed for at least partially absorbing the overall primary radiation and converting into a secondary radiation, preferably with a wavelength different from the wavelength of the primary radiation, in particular of a longer wavelength. The conversion element comprises at least one first phosphor and/or a second phosphor or consists thereof.

According to at least one embodiment, the first phosphor is $Sr(Sr_{1-x}Ca_x)Si_2Al_2N_6:Eu^{2+}$ where $0 \leq x \leq 1$, preferably $0.5 \leq x \leq 1$, for example x=0.6. The first phosphor can be $Sr_2Si_2Al_2N_6:Eu^{2+}$ if x=0. The first phosphor is doped with europium, in particular with $Eu^{2+}$. Alternatively or additionally, the first phosphor can comprise further dopants, for example from the group of rare earths, such as cerium, yttrium, terbium, scandium, ytterbium and/or samarium. Europium or further dopants can partially replace the lattice sites of the Sr and/or Ca.

The proportion of the dopants, in particular europium, can be between 0.1% by weight and 12% by weight, for example 6% by weight to 9% by weight.

The first phosphor $Sr(Sr_{1-x}Ca_x)Si_2Al_2N_6:Eu^{2+}$ can in particular have a colour location Cx between 0.655 and 0.685 and Cy between 0.300 and 0.350. The emission spectrum of the first phosphor $Sr(Sr_{1-x}Ca_x)Si_2Al_2N_6:Eu^{2+}$ has, in particular, a maximum full width at half maximum of 82 nm. A narrow-band emitting first phosphor, which in particular emits radiation from the red spectral range, can thus be provided.

According to at least one embodiment, the first phosphor is $(Sr_{1-y}Ca_y)[LiAl_3N_4]:Eu^{2+}$ where $0 \leq y \leq 1$, preferably $0.5 \leq y \leq 1$, for example y=0.6. The first phosphor can be $Sr[LiAl_3N_4]:Eu^{2+}$ if y=0. The first phosphor has a europium doping, in particular a $Eu^{2+}$ doping. Alternatively or additionally, the first phosphor $(Sr_{1-y}Ca_y)[LiAl_3N_4]:Eu^{2+}$ comprises further dopants, for example from the group of rare earths or lanthanides. Europium or further dopants can partially replace the lattice sites of Sr and/or Ca. The colour locus of the first phosphor Cx is in particular between 0.680 and 0.715 and Cy is between 0.280 and 0.320. The emission spectrum of the first phosphor $(Sr_{1-y}Ca_y)[LiAl_3N_4]:Eu^{2+}$ preferably has a half-width of a peak of at most 55 nm.

The colour locations described here are, in particular, colour locations which occur at an excitation wavelength of the first phosphor from the blue spectral range, for example at 460 nm.

According to at least one embodiment, the first phosphor emits a dominance wavelength between 590 nm and 640 nm inclusive. In particular, the first phosphor is then excited at a wavelength of between 440 nm and 470 nm, for example 460 nm. The first phosphor $Sr(Sr_{1-x}Ca_x)Si_2Al_2N_6:Eu^{2+}$ preferably has a dominance wavelength between 595 nm and 625 nm inclusive. The first phosphor $(Sr_{1-y}Ca_y)[LiAl_3N_4]:Eu^{2+}$ preferably has a dominance wavelength between 623 nm and 633 nm inclusive. The dominance wavelength is the wavelength which describes the hue as perceived by the human eye. In contrast, the peak wavelength represents the wavelength of the maximum of the spectral distribution.

According to at least one embodiment, the conversion element has a second phosphor. The second phosphor is designed in particular to emit radiation from the green and/or yellow spectral range. In particular, the second phosphor is selected from a group comprising alkaline earth metal orthosilicates, SiAlONs, aluminates and SiONs. Preferably, the second phosphor is selected from a group consisting of $(Ba,Sr)_2SiO_4$, beta-SiAlON, $(Y,Lu)_3(Al,Ga)_5O_{12}$ and Ba—SiON. The second phosphor is in particular doped with rare earths and/or lanthanoids, for example with europium ($Eu^{2+}$), cerium ($Ce^{3+}$) or combinations thereof, such as $(Ba, Sr)_2SiO_4:Eu^{2+}$, beta-SiAlON:$Eu^{2+}$, $(Y,Lu)_3(Al,Ga)_5O_{12}:Ce^{3+}$ and Ba—SiON:$Eu^{2+}$.

The second phosphor emits in particular a radiation having a peak wavelength in the spectral range between 510 nm and 590 nm inclusive.

According to at least one embodiment, the second phosphor is an orthosilicate. Preferably, the second phosphor is an alkaline earth orthosilicate doped with rare earths, for example $Eu^{2+}$. In particular, the orthosilicate is $(Ba,Sr)_2SiO_4:Eu^{2+}$. The second phosphor emits in particular a radiation having a peak wavelength in the spectral range between 520 nm and 550 nm inclusive.

According to at least one embodiment, the second phosphor is a beta-SiAlON. A beta-SiAlON is a ceramic phosphor which comprises elements made of silicon, aluminum, oxygen and nitrogen in any ratio and composition. Beta-SiAlONs are sufficiently known to the person skilled in the art and are therefore not explained in more detail at this point. The second phosphor emits in particular radiation having a peak wavelength in the spectral range between 520 nm and 550 nm inclusive.

According to at least one embodiment, the second phosphor is an yttrium aluminium garnet. The second phosphor is preferably $(Y,Lu)_3(Al,Ga)_5O_{12}:Ce^{3+}$. The phosphor can therefore comprise aluminium and/or gallium and yttrium and/or lutetium. In addition, the second phosphor can also contain small amounts of gadolinium and/or dysprosium. The second phosphor emits in particular radiation having a peak wavelength in the spectral range between 530 nm and 550 nm inclusive.

According to at least one embodiment, the second phosphor is Ba—SiON:$Eu^{2+}$. In other words, the second phosphor has silicon in addition to barium as an alkaline earth metal, oxygen and nitrogen in any ratio and composition. Ba—SiONs are sufficiently known to the person skilled in the art and are therefore not explained further at this point.

The second phosphor emits in particular radiation having a peak wavelength in the spectral range between 480 nm and 530 nm inclusive.

According to at least one embodiment, the second phosphor is designed to emit radiation from the green and/or yellow spectral range. The excitation wavelength of the second phosphor is preferably in the blue spectral range, for example at 460 nm. In particular, the second phosphor, preferably the beta-SiAlON, has a colour location of Cx=0.280 to 0.330 and Cy of 0.630 to 0.680.

Alternatively, the colour locus of the second phosphor, in particular for $(Ba,Sr)_2SiO_4:Eu^{2+}$, is Cx=0.33 to 0.380 and Cy=0.590 and 0.650. Alternatively, the colour locus, in particular for $(Y,Lu)_3(Al,Ga)_5O_{12}:Ce^{3+}$, is Cx=0.340 to 0.380 and Cy=0.550 to 0.580.

According to at least one embodiment, the optoelectronic component comprises at least one semiconductor chip for generating a primary radiation from the blue wavelength range and a conversion element which has exactly two phosphors. The blue-emitting semiconductor chip has, for example, a peak wavelength of 380 nm to 480 nm inclusive. The radiation emitted by the semiconductor chip is absorbed and converted by the two phosphors, the first phosphor and the second phosphor. The first phosphor at least partially converts the radiation into a secondary radiation from the red spectral range. The second phosphor converts the primary radiation at least partly into a secondary radiation from the green or yellow-green spectral range, so that the combination of primary radiation and secondary radiation produces white mixed light.

According to at least one embodiment, the primary radiation, secondary radiation of the first phosphor and/or secondary radiation of the second phosphor are formed in a narrow-band manner. In other words, the peaks of the corresponding emission spectra have a maximum half width FWHM of 82 nm, preferably at most 55 nm. An optoelectronic component having a large colour space which efficiently emits total radiation can thus be provided. In addition, less phosphor has to be used. Material and costs can thus be saved. In addition, the production is simpler and more cost-effective compared to an LED consisting of three, a blue-emitting, a green-emitting and a red-emitting semiconductor.

Preferably, a white-emitting optoelectronic component can be provided which can be produced in a cost-effective and simple manner.

According to at least one embodiment, the first phosphor and the second phosphor are dispersed in a matrix material. The matrix material used may be, for example, silicones, such as dimethylvinylsiloxanes and/or vinylalkylpolysiloxanes. Alternatively, epoxy resin or hybrid materials, for example Ormocers, can also be used as a matrix material.

The conversion element is preferably arranged directly on the radiation exit area of the semiconductor chip. The conversion element, which has the first phosphor and the second phosphor dispersed in a matrix material, can be shaped as a potting. In this case, the conversion element can surround both the radiation exit surface and the side surfaces of the at least one semiconductor chip in a material- and/or form-fitting manner.

According to at least one embodiment, the conversion element is formed as a layer system. The layer system has at least two layers, a first layer and a second layer. The first layer can comprise or consist of the first phosphor. The first layer can additionally have a matrix material. The second layer can comprise or consist of the second phosphor. The second layer can additionally have a matrix material. The first layer can be arranged between the semiconductor chip and the second layer. Alternatively, the second layer can be arranged between the semiconductor chip and the first layer in the beam path of the primary radiation.

If the first layer is arranged between the semiconductor chip and the second layer, this means that the first layer is arranged directly downstream of the semiconductor chip. If the second layer is arranged between the semiconductor chip and the first layer, this means that the second layer is arranged directly downstream of the semiconductor chip in the radiation direction.

The individual layers of the layer system of the conversion element can have a layer thickness of 20 μm to 200 μm.

According to at least one embodiment, the layers of the layer system are formed as a ceramic. Alternatively, the phosphors of the corresponding layers can be shaped as particles and dispersed in the matrix material. In this case, the proportion of the dispersed phosphor in the matrix material can be between 1% by weight and 50% by weight.

The invention further relates to a method for producing an optoelectronic component. The optoelectronic component described above is preferably produced using this method. All definitions and embodiments as described above for the optoelectronic component shall apply for the method and vice versa.

According to at least one embodiment, the method for producing an optoelectronic component comprises the following steps:

A) Providing a semiconductor chip for generating a primary radiation in the blue spectral range, B) Providing a conversion element which is arranged in the beam path of the semiconductor chip and for generating secondary radiation from the primary radiation. The conversion element has at least one first and second phosphor, wherein the first phosphor is $Sr(Sr_{1-x}Ca_x)Si_2Al_2N_6:Eu^{2+}$ and/or $(Sr_{1-y}Ca_y)[LiAl_3N_4]:Eu^{2+}$ with $0 \leq x \leq 1$ and $0 \leq y \leq 1$. In particular, the component emits white mixed light, preferably during operation of the component.

The invention further relates to a background illumination or background lighting for a display. Preferably, the background lighting comprises the optoelectronic component described above. All the definitions and statements made for the optoelectronic component also apply to the background lighting for a display and vice versa.

In particular, the optoelectronic component described here is used as a background lighting for television, computer monitors and other possible displays. Alternatively, the optoelectronic component can also be used as a room illumination.

Further advantages, advantageous embodiments and developments will become apparent from the exemplary embodiments described below in conjunction with the figures.

In the figures:

FIGS. 1 to 7A each show a sectional illustration of an optoelectronic component according to an embodiment, FIGS. 9A to 10B show CIE colour diagrams and the associated data according to an embodiment.

In the exemplary embodiments and figures, identical or identically acting elements can in each case be provided with the same reference symbols. The elements illustrated and their size relationships among one another are not to be regarded as true to scale. Rather, individual elements such as, for example, layers, components and regions are represented with an exaggerated size for better representability and/or for a better understanding.

Figure 1:
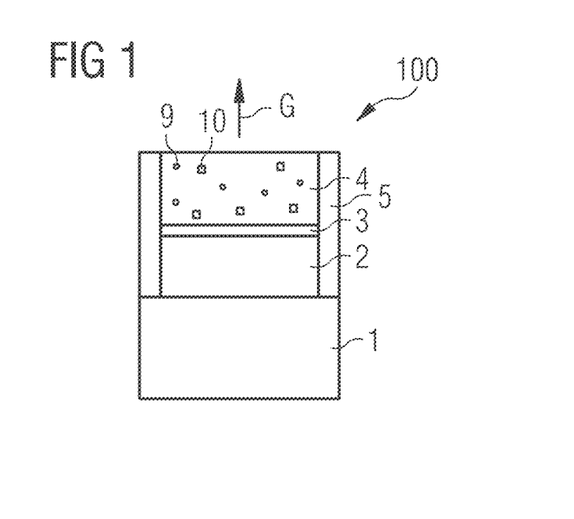

FIG. 1 shows a schematic side view of an optoelectronic component according to an embodiment. The optoelectronic component 100 has a substrate 1. The substrate 1 can be, for example, a semiconductor or ceramic wafer, for example a shaped material made of sapphire, silicon, germanium, silicon nitride, aluminium oxide, titanium dioxide, a luminescent ceramic, such as, for example, YAG. Furthermore, it is possible for the substrate to be a printed circuit board, PCB, a metallic lead frame or other type of connection support. At least one semiconductor chip 2 can be arranged on the substrate 1. The semiconductor chip comprises in particular a III-V compound semiconductor material, for example gallium nitride. The semiconductor chip 2 is preferably designed to emit radiation from the blue spectral range during operation of the optoelectronic component, for example between 440 nm and 480 nm. A conversion element 4 is arranged downstream of the semiconductor chip 2. The conversion element 4 is arranged in the beam path of the semiconductor chip 2 and is designed for converting the primary radiation emitted by the semiconductor chip into a secondary radiation having a changed, usually longer, wavelength. An adhesive layer 3 can optionally be present between the conversion element 4 and the semiconductor chip 2. The adhesive layer 3 can be of a high-refractive or a low-refractive material. The conversion element 4 can have a first phosphor 9 and a second phosphor 10. The first phosphor 9, such as $Sr(Sr_{1-x}Ca_x)Si_2Al_2N_6:Eu^{2+}$ and/or $(Sr_{1-y}Ca_y)[LiAl_3N_4]:Eu^{2+}$, where $0 \leq x \leq 1$ and $0 \leq y \leq 1$, and the second phosphor 10, such as beta-SiAlON, can be embedded in a matrix material, for example in silicone or epoxy. Depending on the selection of the matrix material and on the refractive index thereof, the adhesive layer 3 can be selected. The optoelectronic component 100 can furthermore optionally have a reflection element 5, for example made of titanium dioxide. The reflection element 5 surrounds both the side surfaces of the semiconductor chip 2 and the side surfaces of the conversion element 4. The optoelectronic component 100 is designed to emit white mixed light as the total radiation G.

Figure 2:
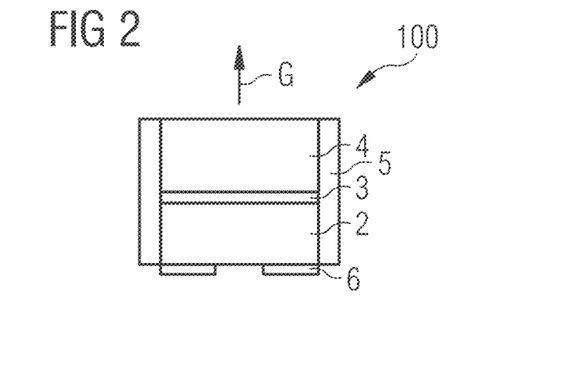

FIG. 2 shows a schematic side view of an optoelectronic component according to an embodiment. The optoelectronic component 100 of FIG. 2 differs from that of FIG. 1 in that the component has no substrate 1. The component 100 of FIG. 2 is thus substrate-free and has contact webs 6. The semiconductor chip 2 is formed here in particular as a top emitter or as a sapphire flip-chip, i.e. has the contact webs 6, which are required for contacting, on a side surface.

Figure 3:
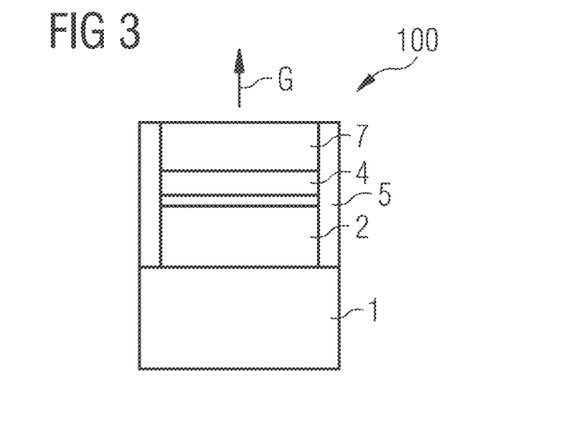

FIG. 3 shows a schematic side view of an optoelectronic component according to an embodiment. The component as shown in FIG. 3 differs from the component 100 of FIG. 1 in that it additionally has a lens 7. The lens can be formed, for example, from silicone and directly to the conversion element, i.e. in direct mechanical and electrical contact.

Figure 4:
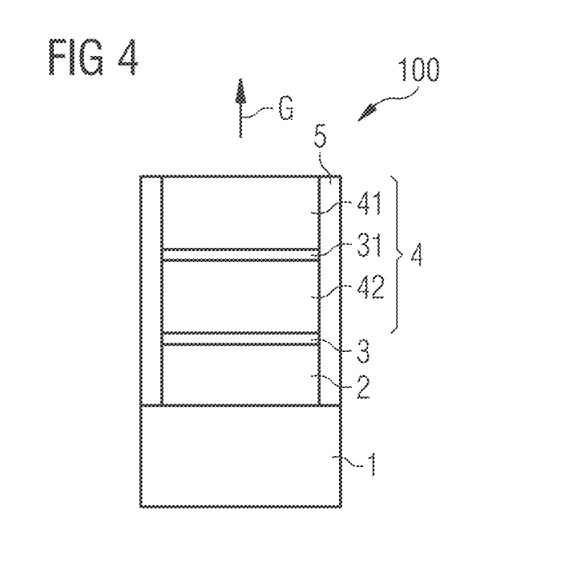

FIG. 4 shows a schematic side view of an optoelectronic component according to an embodiment. The component 100 of FIG. 4 differs from the component 100 of FIG. 1, for example, in that the conversion element 4 is formed as a layer system 41, 42. The conversion element 4 has a first layer 41, which has at least the first phosphor, and a second layer, which has at least the second phosphor. The two layers are spatially separated from one another by a further adhesive layer, which may optionally be present. In the case of the component 100 of FIG. 4, the second layer 42 is arranged between the first layer 41 and the semiconductor chip 2. The second layer 42 is designed, in particular, to emit radiation from the green spectral region or range. The first layer 41 is designed in particular to emit radiation from the red spectral range. The semiconductor chip 2 is designed in particular to emit primary radiation from the blue spectral range, so that the total radiation G is a combination of the primary radiation of the semiconductor chip 2 and the two secondary radiations of the layers 41, 42 of the conversion element 4. The total radiation G is then in particular white mixed light.

Figure 5:
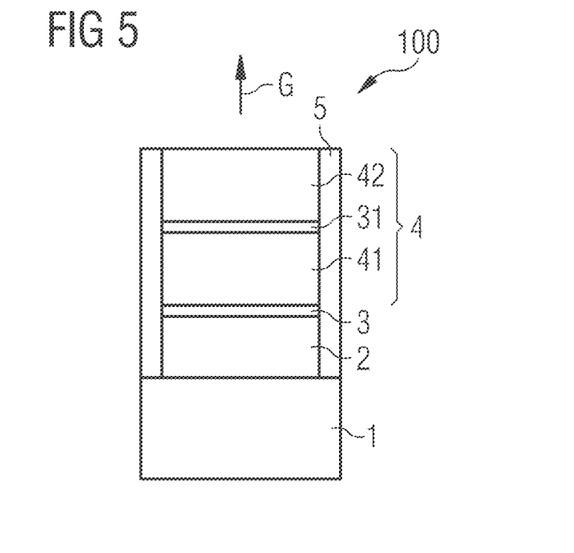

FIG. 5 shows a side view of an optoelectronic component according to an embodiment. The optoelectronic component 100 of FIG. 5 differs from the optoelectronic component 100 of FIG. 4 in that the layers 41, 42 of the conversion element 4 are interchanged. In other words, the first layer 41 in the component 100 of FIG. 5 is now arranged between the semiconductor chip 2 and the second layer 42. In other words, the red-emitting first layer 41 of the conversion element 4 is thus arranged downstream of the semiconductor chip 2 and the green, yellow or green-yellow emitting second layer 42 of the conversion element 4 are arranged downstream of the red-emitting first layer 41.

Figure 6:
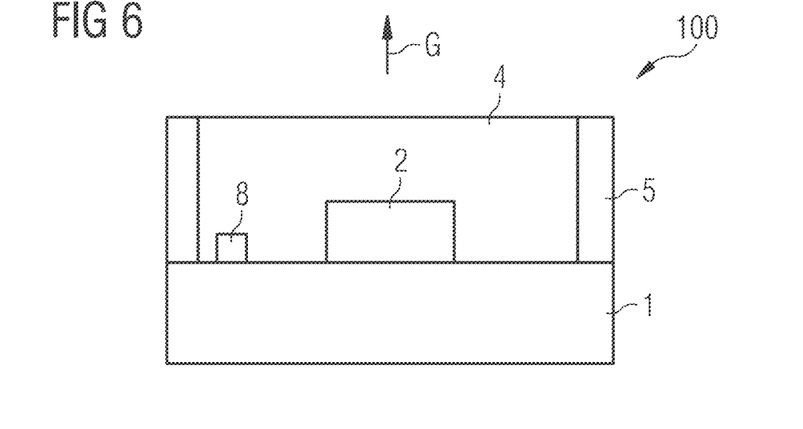

FIG. 6 shows a schematic side view of an optoelectronic component 100 according to an embodiment. The optoelectronic component 100 of FIG. 6 is almost identical to the optoelectronic component 100 of FIG. 1, except that the component of FIG. 6 additionally has a protective diode (ESD) 8. Said protective diode 8 can optionally be present in the component and can be spaced laterally from the semiconductor chip 2. The protective diode 8 can be arranged on the substrate 1 within the recess 4 of a component. The reflection element can be part of a housing.

Figure 7A:
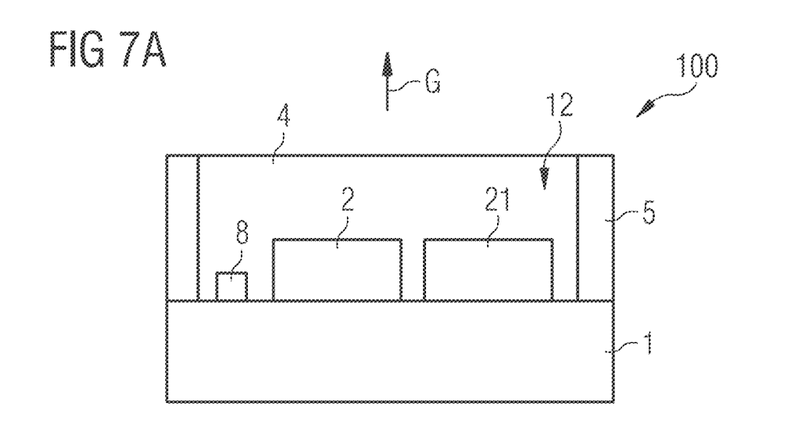

FIG. 7A shows a schematic side view of an optoelectronic component 100 according to an embodiment. The component of FIG. 7A differs from the component 100 of FIG. 6 in that the component 100 has a further semiconductor chip 21. In other words, the component 100 now has two semiconductor chips 2, 21. The two semiconductor chips 2, 21 are spaced apart laterally from one another and are arranged on the substrate 1. Furthermore, a protective diode (ESD) 8 may optionally be present. The two semiconductor chips 2, 21 can be arranged in a common recess 12. In this case, the conversion element is designed as a potting and preferably has the first phosphor and the second phosphor dispersed in a matrix material (not shown here).

Figure 7B:
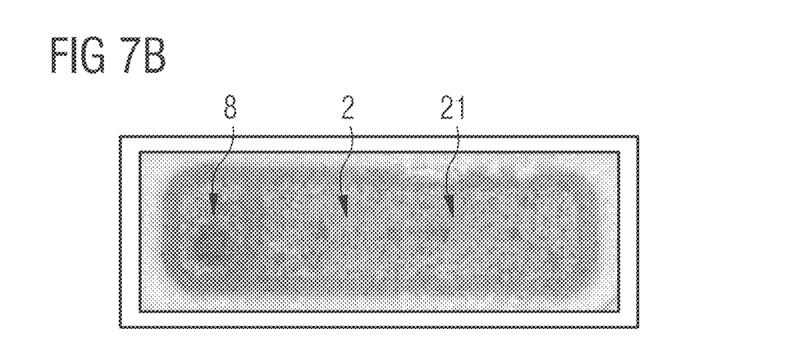
FIG. 7B shows a plan view of an optoelectronic component of FIG. 7A according to an embodiment.

FIG. 7B shows a plan view of an optoelectronic component. In particular, FIG. 7B shows the plan view of a protective diode 8, onto the radiation exit area of the semiconductor chip 2 and onto the radiation exit area of the semiconductor chip 21.

Figure 8A:
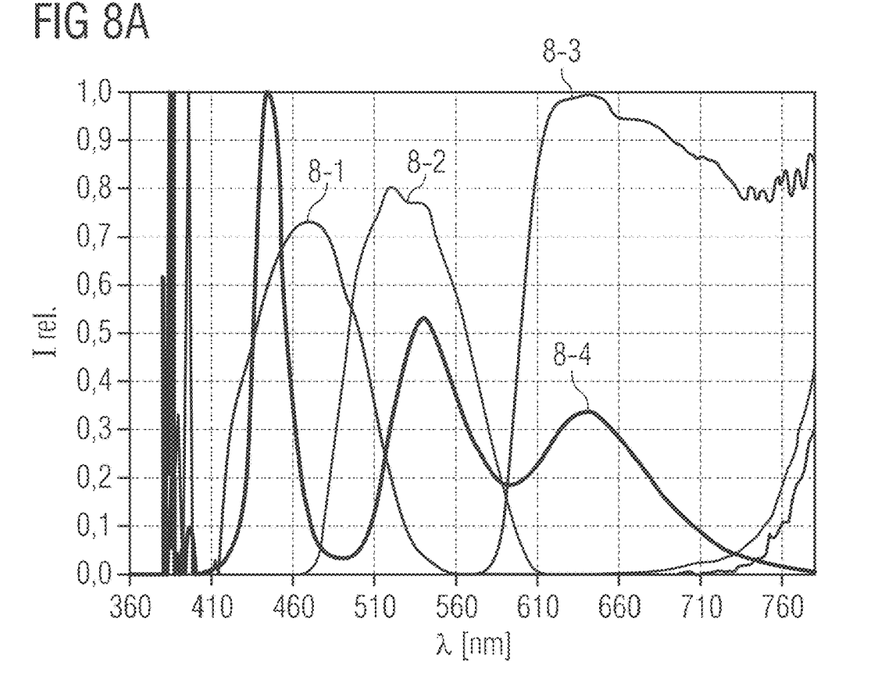
FIGS. 8A and 8B show emission spectra according to an embodiment.
Figure 8B:
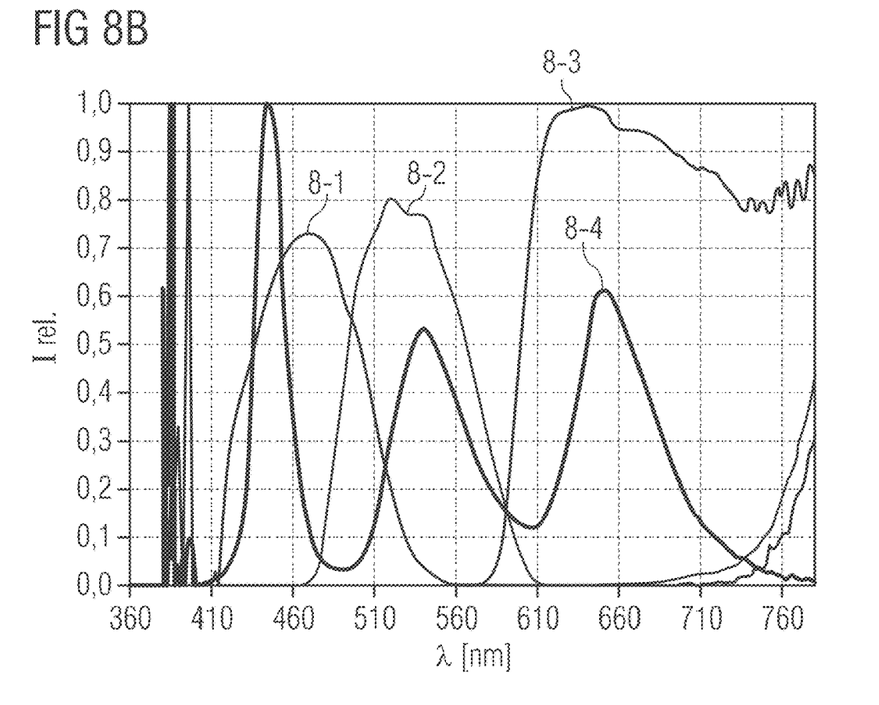

FIGS. 8A and 8B show emission spectra according to an embodiment and in each case one example of the transmission profile of a blue 8-1, green 8-2 and red 8-3 colour filter. The relative intensity $I_{rel}$ is shown in both figures as a function of the wavelength $\lambda$ in nm. FIGS. 8A and 8B each show the overall emission, that is to say the emission of primary radiation and secondary radiation, of a semiconductor chip in conjunction with a first and a second phosphor 8-4. In the case of FIGS. 8A and 8B, the second, in this case green-emitting phosphor is in each case a beta-SiAlON. In the case of FIG. 8A, the first phosphor is $Sr(Ca,Sr)Si_2Al_2N_6:Eu^{2+}$. In the case of FIG. 8B, the first phosphor is $(Sr,Ca)[LiAl_3Ni_4]:Eu^{2+}$. Conventional LCD filter systems consist of three (blue, green and red) or four (blue, green, yellow and red) colour filters.

The LCD filters generally have a half-width FWHM of typically 70 nm to 120 nm, in which the transmission can be electrically controlled. In this case, the transmitted light is obtained from the superposition of the transmission of the individual colour filters. Certain gaps thus arise at the transition points between the filters in the visible spectral range. Consequently, in the case of a broadband almost continuous spectrum, a certain portion of the emitted LED light is absorbed in the filters. In order to be able to obtain the maximum emitted light quantity from the component in the case of completely opened filters on the screen surface, it is therefore advantageous to use narrow-band phosphors, which emit in the region of the individual filter curves (FIGS. 8A and 8B). In this case, it is particularly important that the phosphors used, i.e. the first and second phosphors, in each case emit only within a filter region in order to be able to ensure the largest possible colour space, wherein the properties of an optoelectronic component can be adapted accordingly by different phosphors. The trend is more and more towards larger colour spaces, for example DCI-P3 or Rec2020. Therefore, spectrally particularly well-adapted phosphors are required which make this possible.

Figure 9A:
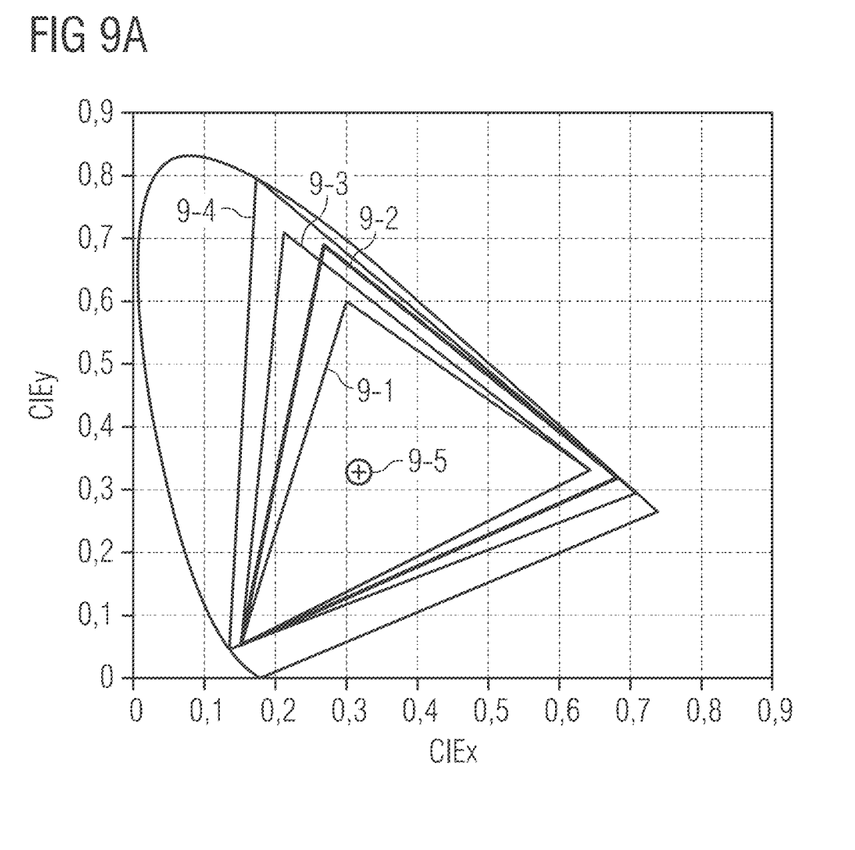
Figure 9B:
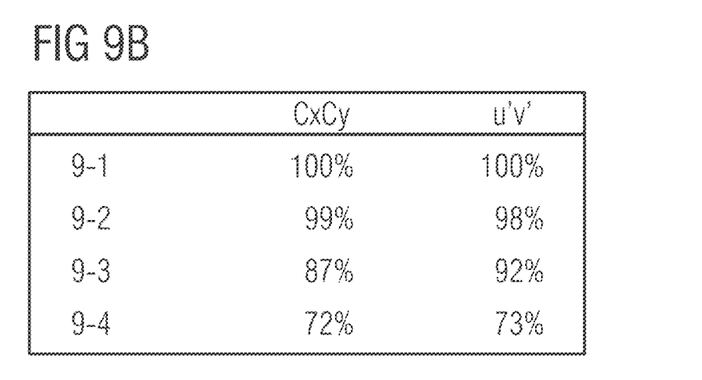
Figure 10A:
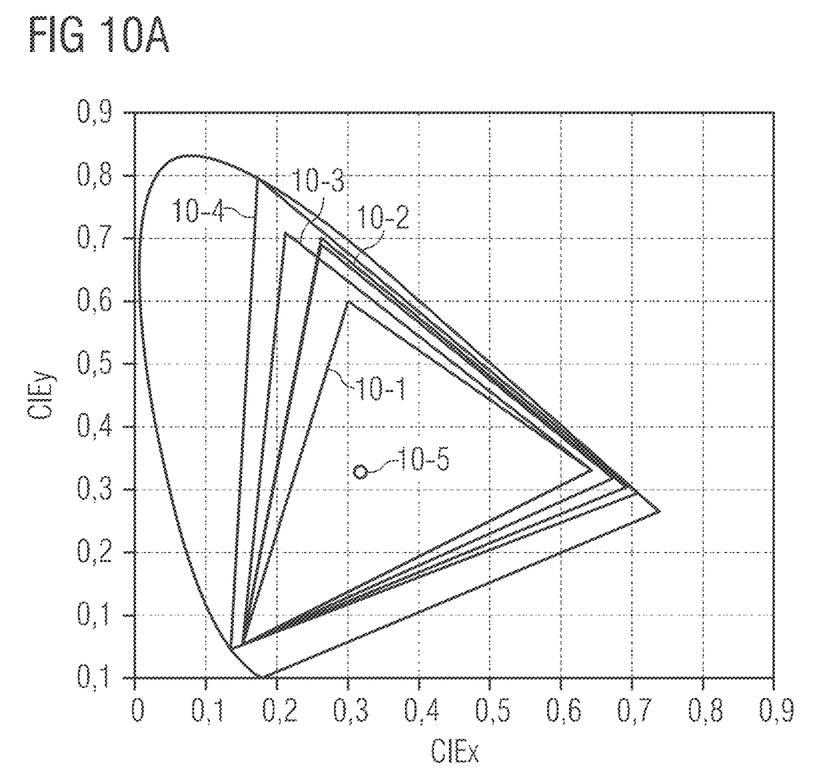

FIGS. 9A and 10A each show a CIE colour standard diagram. The CIEy is represented as a function of CIEx. 9-1 or 10-1 corresponds here to the colour space SRGB, 9-2 or 10-2 corresponds to the colour space DCI-P3, 9-3 or 10-3 corresponds to the colour space Adobe and 9-4 or 10-4 corresponds to the colour space Rec2020. In the images, the covered colour space is additionally represented by the LED and after the filter evaluation. This colour space that can be achieved by the component is almost perfectly congruent with the DCI-P3 colour space (9-2 or 10-2). These colour spaces are known to the person skilled in the art and are therefore not explained in more detail here. FIG. 9B shows in each case the corresponding covering of the described colour spaces in CxCy or u'v' coordinates by an optoelectronic component of an embodiment in which the primary radiation is generated by a blue-emitting semiconductor chip and the secondary radiation is generated by a first phosphor, which is $Sr(Sr_{1-x}Ca_x)Si_2Al_2N_6:Eu^{2+}$, and by a second phosphor, which is a beta-SiAlON in this case.

Figure 10B:
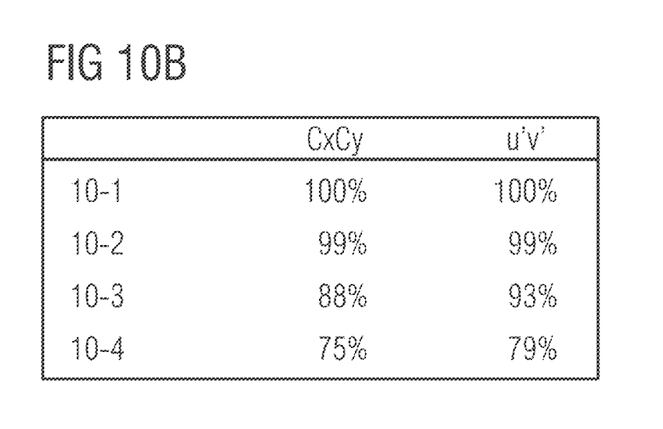

FIG. 10B shows in each case the corresponding coverage of the described colour spaces in CxCy or u'v' coordinates by means of an optoelectronic component of an embodiment in which the primary radiation is generated by a blue-emitting semiconductor chip and the secondary radiation is generated by a first phosphor, $(Sr_{1-y}Ca_y)[LiAl_3Ni_4]:Eu^{2+}$, and by a second phosphor, which is a beta-SiAlON in this case.

FIGS. 9A and 9B show the data of a system comprising a semiconductor chip which emits primary radiation from the blue spectral range, of a second phosphor being beta-SiAlON and of a first phosphor being $Sr(Sr_{1-x}Ca_x)Si_2Al_2N_6:Eu^{2+}$. FIGS. 10A and 10B show the data of a system comprising a blue-emitting semiconductor chip 2, a beta-SiAlON as the second phosphor and a first phosphor of the type $(Sr_{1-y}Ca_y)[LiAl_3N_4]Eu^{2+}$. The reference characters 9-5 and 10-5 designate the white point of the CIE colour standard diagram.

The exemplary embodiments described in conjunction with the figures and the features thereof can also be combined with one another in accordance with further exemplary embodiments, even if such combinations are not explicitly shown in the figures. Furthermore, the exemplary embodiments described in conjunction with the figures can have additional or alternative features according to the description in the general part.

The invention is not restricted to the exemplary embodiments by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

This patent application claims the priority of German patent application 10 2015 120 775. 3, the disclosure content of which is hereby incorporated by reference.

LIST OF REFERENCE NUMERALS

100 optoelectronic component
1 substrate
2 semiconductor chip
3 adhesive layer
4 conversion element
5 reflection element or housing
6 contact webs
7 lens
8 protective electrode
9 first phosphor
10 second phosphor
11 matrix material
G total emission
12 recess
21 further semiconductor chip
31 further adhesive layer
41 first layer
42 second layer

The invention claimed is:

1. An optoelectronic component comprising
a semiconductor chip for generating a primary radiation in the blue spectral range,
a conversion element which is arranged in a beam path of the semiconductor chip and is designed to generate secondary radiation from the primary radiation,
wherein the conversion element comprises at least one first phosphor and a second phosphor, wherein the first phosphor is $Sr(Sr_{1-x}Ca_x)Si_2Al_2N_6:Eu^{2+}$ and/or $(Sr_{1-y}Ca_y)[LiAl_3N_4]:Eu^{2+}$ with $0 \leq x \leq 1$ and $0 \leq y \leq 1$,
a reflection element,
wherein a total radiation (G) exiting from the component is white mixed light,
wherein the conversion element is formed as a layer system comprising at least two layers,
wherein the first layer comprises the first phosphor and the second layer comprises the second phosphor,
wherein the first layer is arranged between the semiconductor chip and the second layer, or wherein the second layer is arranged between the semiconductor chip and the first layer, and
wherein the reflection element directly surrounds both the side surfaces of the semiconductor chip and the side surfaces of the conversion element.

2. The optoelectronic component according to claim 1, wherein the first phosphor is $Sr(Sr_{1-x}Ca_x)Si_2Al_2N_6:Eu^{2+}$ having a colour locus Cx between 0.655 and 0.685 and Cy between 0.300 and 0.350 and/or wherein the emission spectrum of the first phosphor $Sr(Sr_{1-x}Ca_x)Si_2Al_2N_6:Eu^{2+}$ has a maximum full width at half maximum of 82 nm.

3. The optoelectronic component according to claim 1, wherein the first phosphor $(Sr_{1-y}Ca_y)[LiAl_3N_4]:Eu^{2+}$ has a color locus Cx between 0.680 and 0.715 and Cy between 0.280 and 0.320, and/or wherein the emission spectrum of the first phosphor $(Sr_{1-y}Ca_y)[LiAl_3N_4]:Eu^{2+}$ has a maximum full width at half maximum of 55 nm.

4. The optoelectronic component according to claim 1, wherein an emitted radiation of the first phosphor has a dominance wavelength in the range of 590 nm to 640 nm.

5. The optoelectronic component according to claim 1, wherein the conversion element has a second phosphor selected from the group consisting of $(Ba, Sr)_2SiO_4$, beta-SiAlON, $(Y,Lu)_3(Al,Ga)_5O_{12}$ and Ba—SiON, wherein the second phosphor is doped with rare earths and is designed for emitting radiation having a peak wavelength in the spectral range between 510 nm and 590 nm.

6. The optoelectronic component according to claim 1, wherein the second phosphor is a beta-SiAlON.

7. The optoelectronic component according to claim 1, wherein the first phosphor and the second phosphor are dispersed in a matrix material and are arranged directly downstream of a radiation exit area of the semiconductor chip.

8. The optoelectronic component according to claim 1, which has a further semiconductor chip, which is designed to generate a further primary radiation in the blue spectral range, wherein the semiconductor chips are arranged in a common recess, wherein the conversion element is formed as a potting and surrounds both semiconductor chips in a form-fitting manner.

9. The optoelectronic component according to claim 1, wherein the blue spectral range has a peak wavelength maximum between 380 nm and 480 nm.

10. A background lighting for a display, which comprises at least one optoelectronic component according to claim 1.

11. A method for producing an optoelectronic component according to claim 1, comprising the following steps:
   A) Provision of a semiconductor chip for generating a primary radiation in the blue spectral range,
   B) Provision of a conversion element which is arranged in the beam path of the semiconductor chip and is designed to generate secondary radiation from the primary radiation, wherein the conversion element has at least one first and second phosphor,
   wherein the first phosphor is $Sr(Sr_{1-x}Ca_x)Si_2Al_2N_6:Eu^{2+}$ and/or $(Sr_{1-y}Ca_y)[LiAl_3N_4]:Eu^{2+}$ where $0 \leq x \leq 1$ and $0 \leq y \leq 1$, wherein the component emits white mixed light at least during operation.

12. The optoelectronic component according to claim 1, wherein the conversion element is arranged directly on the radiation exit area of the semiconductor chip.

13. The optoelectronic component according to claim 1, wherein an adhesive layer is arranged between the semiconductor chip and the conversion element.

14. The optoelectronic component according to claim 1, wherein the first layer and the second layer are spatially separated from one another by a further adhesive layer.

15. The optoelectronic component according to claim 1, wherein the first layer consists of the first phosphor.

16. The optoelectronic component according to claim 1, wherein the second layer consists of the second phosphor.

* * * * *